United States Patent [19]
Sonnenberg et al.

[11] Patent Number: 6,123,995
[45] Date of Patent: Sep. 26, 2000

[54] METHOD OF MANUFACTURE OF MULTILAYER CIRCUIT BOARDS

[75] Inventors: Wade Sonnenberg, Upton, Mass.; Jeffrey P. Burress, Bristow, Va.; David Oglesby, Marlborough; James G. Shelnut, Northboro, both of Mass.

[73] Assignee: Shipley Company, L.L.C., Marlborough, Mass.

[21] Appl. No.: 09/036,235

[22] Filed: Mar. 6, 1998

[51] Int. Cl.[7] .................................. B05D 3/04; C25D 5/34
[52] U.S. Cl. .......................... 427/336; 427/337; 427/97; 205/125; 205/166; 205/210
[58] Field of Search ...................... 205/210, 166, 205/125; 427/96, 97, 304, 305, 306, 307, 335, 336, 337

[56] References Cited

U.S. PATENT DOCUMENTS

| | | |
|---|---|---|
| 4,218,498 | 8/1980 | Cohen ....................................... 427/336 |
| 5,415,762 | 5/1995 | Allardyce et al. . |
| 5,528,000 | 6/1996 | Allardyce et al. . |
| 5,648,125 | 7/1997 | Cane ........................................ 427/534 |
| 5,667,662 | 9/1997 | Sonnenberg et al. . |

*Primary Examiner*—Brian K. Talbot
*Attorney, Agent, or Firm*—Peter F. Corless; Darryl P. Frickey; S. Matthew Cairns

[57] ABSTRACT

A method of providing an electrically conductive polymer coating on a copper clad circuit board prior to electroplating is disclosed. The method teaches the application of certain organic solvents to a conductive polymer composition already applied to the board but before drying the conductive polymer composition to remove liquids therefrom to form a conductive polymer film.

5 Claims, 1 Drawing Sheet

METHOD OF MANUFACTURE OF MULTILAYER CIRCUIT BOARDS

BACKGROUND OF THE INVENTION

This invention is directed to a new and improved method of manufacture of circuit boards e.g., those having a plurality of through holes interconnecting the various metal layers of a multilayer circuit board.

Multiple layer copper clad circuit boards are used in constructing many electronic products. These circuit boards typically are copper cladding layers e.g., double sided or multilayer, formed into various circuit configurations separated by dielectric material layers. In order to interconnect the copper layers, through holes are provided which extend between the layers. The through holes are electroplated with copper in order to form a conductive pathway between the copper clad layers. In order to facilitate electroplating of the through holes, a thin layer of the conductive polymer film has been used over the board, see U.S. Pat. No. 5,528,000 and 5,415,762 (the entire contents of these patents are incorporated herein by reference hereto). The aforementioned patents should also be referred to for a description of the art. Thereafter, the conductive polymer liquid composition is then dried to remove liquids to form a film thereof. Etchants are then used to remove the conductive polymer positioned over the conductive copper cladding without removing the conductive polymer layer from the dielectric extending into the hole to expose the clad copper layers in the hole prior to electroplating. Such processes have used microetchant compositions which are based among other things on sulfuric acid and hydrogen peroxide combinations, see Printed Circuits Handbook, 4th Edition, Clyde Combs Edition McGraw-Hill © 1996, Chapter 21, 4, Etching Solutions and in particular Chapter Section 21, 4,2 Sulfuric acid—Hydrogen Peroxide Etchant Systems (the entire contents of this chapter are incorporated herein by reference hereto). Thereafter, the product has been electroplated with copper to form the circuit board.

This present invention provides substantially improved results in comparison with water rinsed polypyrrole conductive polymer systems. In particular the present invention provides improved substrate coverage over glass fiber substrates, longer dwell times in the final etch giving cleaner interconnects and less expensive equipment costs for operating the process. The present invention also provides improved adhesion over graphite systems.

It has now been found that new and improved products are formed by applying certain organic solvent coatings as will be described herein, e.g., by dipping or spraying the organic solvent coating on the conductive polymer suspension already on the copper clad circuit prior to the drying, etching and then electroplating steps to form an electrically conductive film.

In this way, it is now possible to provide circuit boards having substantially fewer interconnect defects due to poor bonding between the copper cladding of the circuits extending to the hole side surface and the electroplated copper.

BRIEF SUMMARY OF THE DISCLOSURE

This disclosure is directed to a method of improving coverage of an electrically conductive polymer on a substrate such as a printed circuit board. In this process an applied conductive polymer in a liquid composition already applied to the board is first coated with certain organic solvents most preferably 1,2-propylene glycol prior to drying to form a conductive polymer film. It has been found that this process unexpectedly improves coverage of the electrically conductive polymer film on the substrate, i.e., the circuit board. The solvents herein are solvents at room temperature.

DETAILED DESCRIPTION OF THE INVENTION

Figure 1:
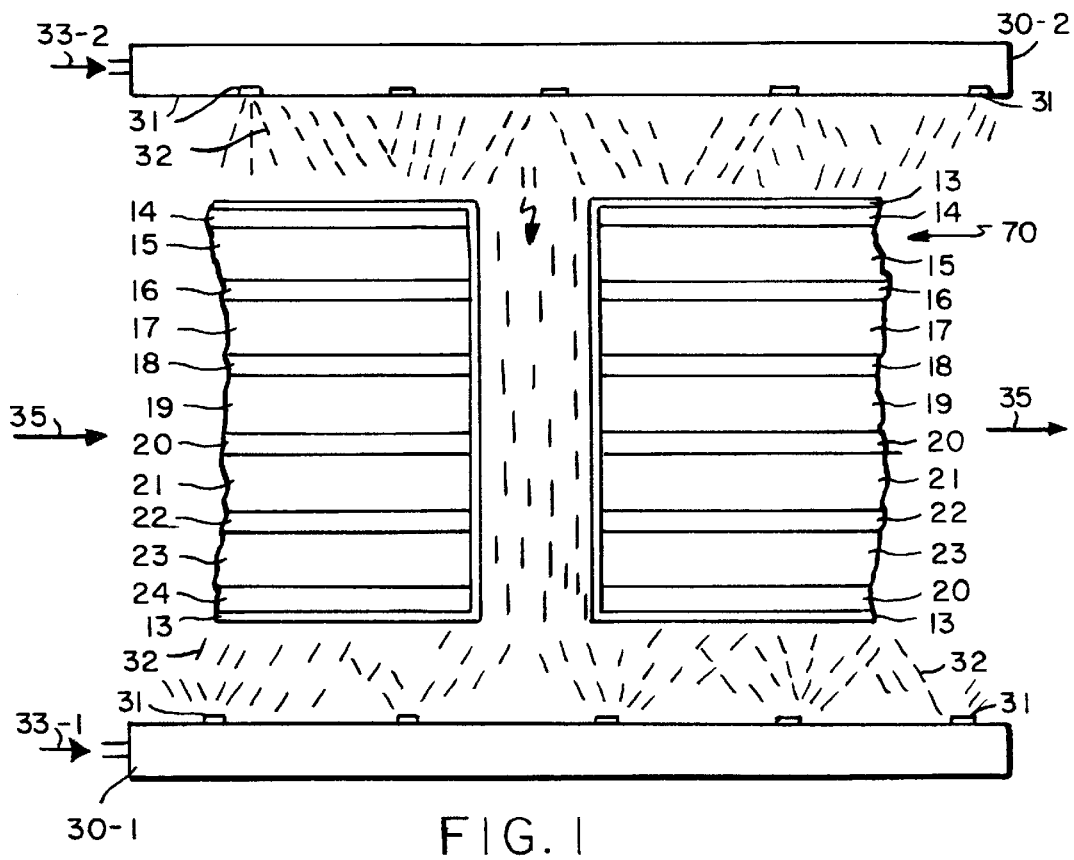
FIG. 1 is an enlarged sectional drawing of a portion of a multilayer printed circuit board during spraying thereof with the organic solvent e.g., 1,2-polyethylene glycol to illustrate the method of the invention.

Reference should now be had to FIG. 1 for a detailed explanation of the method of this invention. In this figure, there is shown a typical portion of multilayer circuit board 10 at its conventional processing stage wherein a through hole or via 11 has been drilled or punched to leave wall 11a between the copper clad top layer circuit 14 and the bottom copper clad bottom layer circuit 24 and which is also conventionally coated with an electrically conductive polymer in a liquid 13. Typically, the electrically conductive film formed after drying thereof is of a few angstroms in thickness to 0.001 inches in thickness. The conductive film is formed in order to perform electroplating of the through hole wall 11a so there is a complete circuit. Between the top and bottom layers as shown in FIG. 1, there are typical nonconductive (insulator) layers 15, 17, 19 21 and 23 having sandwiched therebetween and bonded thereto copper clad circuit layers 16, 18, 20 and 22.

As set forth in U.S. Pat. No. 5,415,762, the electrically conductive polymer film 13 may be a polymerized pyrrole (See col. 2, 3, 4 and 5 of Pat. No. 5,415,762). Electrically conductive films formed of other materials as described in this U.S. Pat. No. 5,415,762 are also useful.

The conductive polymer is applied in a liquid (usually as a colloidal suspension) as disclosed in the aforementioned patents.

It has been unexpectedly found that to achieve better coverage of the conductive polymer film on the circuit board 10 without clogging the through hole 11, the use of a later applied coating 32 of a certain organic solvents, most preferably 1,2-propylene glycol, is highly advantageous prior to drying of the electrically conductive polymer composition to remove liquids therefrom. The organic solvent used herein is one having one or more hydroxyls (e.g., 1 to 4) or other groups which provide when tested according to the procedure used in Examples 1 to 21 a coverage factor (CF) of less than one (1). The coverage factor as will be seen is related to the thickness of the copper plated on the organic solvent coated conductive polymer from a bath as will be described. The coating 32 may be preferably applied as shown in FIG. 1 using wedge type spraying systems 30-1 and 30-2 having a plurality of spray nozzles 31, preferably 4 to 5 nozzles on each as shown by arrows 35 or by dipping. The spraying system is supplied from a reservoir (not shown) with the organic polyol through inlets 33-1 and 33-2 respectively.

The circuit board may be conventionally moved through the spray 32 vertically as shown by arrows 35 or horizontally. It is preferred that flow of the liquid spray be 1 to 9 gallons per minutes (gpm), dwell time of the circuit board 10 in the spray is preferably 0.3 to 1 minutes, and the spray is applied at a pressure of 2 to 8 psi. The preferred parameters of the spray as applied is as follows: Flow: 7 gpm, Dwell Time: 20 seconds, Pressure: 2 psi. Typically, the electrically conductive polymer composition after spraying of the organic compound thereover, e.g., 1,2-propylene glycol is dried to remove liquids. It is preferably accomplished in a forced hot air oven by placing the board 10 therein at e.g., at 185° F. for ten minutes. The circuit board may also be conventionally dipped in a container containing the organic solvent to form a coating.

Thereafter, etching of the electrically conductive polymer takes place to expose the copper prior to electroplating as disclosed and known in the art to connect the various multilayers together.

The solvent used herein which meets the requirements for a CF of less than 1 include monohydric aliphatic alcohols containing 1 to 8 carbon atoms, dihydric alcohols, ethers or acetates of said hydric alcohols, sulfoxides, cyclohexyl acetate, propylene carbonate, n-methylpyrolidone, and Di acetone alcohol.

The organic solvent alcohol is preferably a glycol of the formula $C_nH_{2n}(OH)_2$ where n is an integer of 2 to 8 or a glycol of the formula $C_nH_{2n}O_x$ where n is an integer of 2 to 8 and x is 3. Included within these formulas, are 1,2-propylene glycol (referred to herein as propylene glycol), ethylene glycol, 1,3-butylene glycol, dipropylene glycol, tetraethylene glycol and triethylene glycol, dipropylene glycol, tetraethylene glycol and triethylene glycol. The 1,2-propylene glycol is preferably applied at about 100% purity at ambient temperature.

The following Examples 1 to 21 are also illustrative of the invention:

| No. | Name | CF (coverage factor) |
|---|---|---|
| 1 | Di (propylene glycol) methyl ether acetate | .1* |
| 2 | N-methyl-2 pyrrolidone | .15* |
| 3 | Propylene glycol methyl ether acetate | .43 |
| 4 | Di acetone alcohol (4-hydroxy-4-methyl-2-pentanone | .43 |
| 5 | 1-Octanol | .85 |
| 6 | 1-Heptanol | .48 |
| 7 | Hexanol | .63 |
| 8 | 1-Pentanol | 0. |
| 9 | 1-Butanol | 0. |
| 10 | 2 Ethyl 1 Hexanol | .38 |
| 11 | 1,2 Propanediol (also known as 1,2-propylene glycol) | 0. |
| 12 | 1,3 Butanediol (also known as 1,3-butylene glycol) | .2* |
| 13 | Propylene carbonate | .25 |
| 14 | Propylene glycol butyl ether | 0 |
| 15 | Di (propylene glycol) butyl ether | 0 |
| 16 | Di (propylene glycol) | 0 |
| 17 | Di (propylene glycol) methyl ether | .05* |
| 18 | Tripropylene glycol monomethyl ether | 0 |
| 19 | Cyclohexyl acetate | .25 |
| 20 | Methyl sulfoxide | 0 |
| 21 | Isopropanol | 0 |

*hole voids

The copper clad parts (e.g., circuit board as shown in FIG. 1 with 30 holes as described below) were dipped in the above solvents in examples 1 to 21 for one minute at room temperature.

The parts were then rinsed with deionized water for one minute, then dried at 90° C. for 5 minutes. The solvents were screened for performance by rating copper coverage in the 30 holes 14 mil diameter hole of a 0.094 inch thick circuit board. The coverage factor (CF) using se (as a control) in the same test was 2.2.

The coverage factor (CF) is determined as follows: A copper clad circuit board with thirty (30) holes, each through hole being 14 mil in diameter with the circuit board in which re formed being 0.094 inches in thickness. The circuit board 40 with the thirty holes 41 and with the conductive polypyrrole polymer coating 10 g/l as pyrrol with ethylbenzene sulfonate as the dopant and Rhodasurf TB 970 as the stabilizer to which there is applied the solvents of examples 1 to 21 were then etched and electroplated using a conventional acid etch and acid copper sulfate bath e.g. Shipley copper sulfate bath EP 1100 at 20 amps per square foot for 100 minutes. The thirty holes for each sample are cross-sectioned and then examined at 200X under a microscope and etched to expose thickness of the plating now defining the hole. Etching is preferably used to more easily measure the thicknesses $S_1$, $S_2$, $S_3$, $S_4$, $C_1$ and $C_2$ of the plated copper on the hole 41 sidewalls and adjacent top surfaces on the board 40 surrounding the holes (see FIG. 2).

Figure 2:
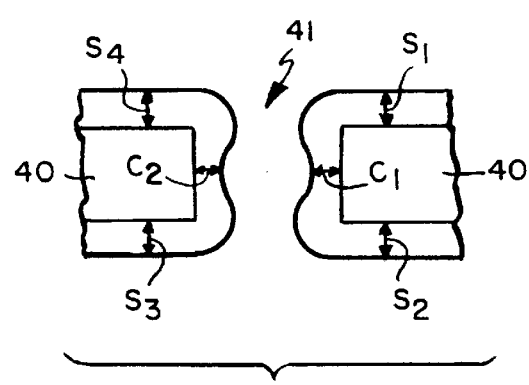
FIG. 2 is a diagram illustrating plating thickness on the surfaces defining holes which are used in measuring plating coverage.

For each hole there is calculated a throwing power $$(T.P.) = \frac{(C_1 + C_2)/2}{(S_1 + S_2 + S_3 + S_4)}$$

based on the measured thicknesses of the electroplated metal layer on the hole sidewalls and the surfaces adjacent to the hole as shown in FIG. 2.

The T.P. for each hole is rated according to the following criteria:

O when T.P. is greater than 0.45
V when T.P. is greater than 0.35 to 0.45
S when T.P. is greater than 0.25 to 0.35
T when T.P. is less than 0.25.

C.F. is then calculated according to the following formula for the 30 holes where # represents the number of holes determined as having a particular measured throwing power, i.e., the coverage about the hole as defined above.

C.F. is then equal to # of V holes +2 times # of S holes +4 times the # of T holes divided by the total number of holes, which in this case is 30.

For example if C.F.=0.63, the calculation could be as follows:

$$\frac{5(V\# \text{ holes}) + 2 \text{ times } 3(S\# \text{ holes}) + 4 \text{ times } 2(T\# \text{ holes})}{30} = \frac{19}{30}$$

The number of O holes is not considered in calculating CF since CF provides a value of the # of holes which are not considered to be the best or perfect.

where # of V holes (based on the throwing power)=5
# of S holes (based on the throwing power)=3
# of T holes (based on the throwing power)=2

All other hole coverage was measured and were given a 0 because the T.P. was greater than 45.

A hole void is considered in the calculation as a T coverage hole.

A CF of all organic solvents of 1 or less is preferred and a CF of 0.2 or less is most preferred.

It should be realized, various modifications may be made to this invention and accordingly this invention should not be construed as being limited to the solvents disclosed or the examples herein.

What is claimed is:

1. A method of forming a conductive polymer film on a circuit board having through holes wherein a coating of a liquid conductive polymer composition has been applied to the circuit board, the method comprising:

applying to the liquid conductive polymer composition but prior to drying thereof, an organic polyol coating comprising an organic solvent at room temperature and having one or more hydroxy or other groups, said solvent providing when tested according to the procedure used in Examples 1 to 21, a CF of less than 1 wherein the solvent is selected from the group consisting of a monohydric aliphatic alcohol containing 1 to 8 carbons, a dihydric alcohol, esters or acetates of said hydric alcohols, a sulfoxide, cyclohexyl acetate, propylene carbonate, n-methyl pyrolidone and di-acetone alcohol.

2. The method of claim 1 wherein the conductive polymer is a polymerized pyrrole.

3. The method of claim 1 further comprising electroplating the circuit board after applying the polyol.

4. A method of forming an electrically conductive coating on a circuit board having copper cladding thereon and through-holes comprising applying an organic solvent on a coating of a liquid electrically conductive polymer composition and then drying the same to remove the liquid to leave a coating of electrically conductive polymer film, the solvent is selected from the group consisting of a monohydric aliphatic alcohol containing 1 to 8 carbon atoms, a dihydric alcohol, esters or acetates of said hydric alcohols, a sulfoxide, cyclohexyl acetate, propylene carbonate, n-methyl pyrolidone, and di-acetone alcohol.

5. The method of claim 4 wherein the conductive polymer is a polymerized pyrrole.

* * * * *